United States Patent [19]
Hayes et al.

[11] Patent Number: 6,015,083
[45] Date of Patent: Jan. 18, 2000

[54] DIRECT SOLDER BUMPING OF HARD TO SOLDER SUBSTRATE

[75] Inventors: Donald J. Hayes, Plano; Michael T. Boldman, Murphy; Virang G. Shah, Plano, all of Tex.

[73] Assignee: MicroFab Technologies, Inc., Plano, Tex.

[21] Appl. No.: 08/789,640

[22] Filed: Jan. 27, 1997

Related U.S. Application Data

[63] Continuation-in-part of application No. 08/581,273, Dec. 29, 1995, Pat. No. 5,772,106.
[51] Int. Cl.[7] .............................. B23K 1/00; B23K 31/02
[52] U.S. Cl. ........................ 228/254; 228/219; 228/256
[58] Field of Search .................................. 228/219, 254, 228/262.51, 256

[56] References Cited

U.S. PATENT DOCUMENTS

| | | | |
|---|---|---|---|
| 3,881,953 | 5/1975 | Turowski | 136/26 |
| 4,387,073 | 6/1983 | Westbrook | 420/507 |
| 4,588,657 | 5/1986 | Kujas | 428/641 |
| 4,917,861 | 4/1990 | Schaffer et al. | 420/463 |
| 5,065,932 | 11/1991 | Hayden et al. | 228/219 |
| 5,120,498 | 6/1992 | Cocks | 420/580 |
| 5,193,738 | 3/1993 | Hayes | 228/254 |
| 5,597,110 | 1/1997 | Melton et al. | 228/254 |

OTHER PUBLICATIONS

"Solder for Bonding Semiconductor Chip to Header . . . ," Derwent–ACC–No.: 1980–50474C (Abstract for JP 55–72047A).

Primary Examiner—Patrick Ryan
Assistant Examiner—Jeffrey T. Knapp
Attorney, Agent, or Firm—Locke Liddell & Sapp LLP

[57] ABSTRACT

A method has been formed for direct solder "bumping" of wafers, chips and interconnection pads or traces on hard to solder surfaces such as aluminum and indium tin oxide. It has been discovered that conventional solders modified by the addition of a light reactive metal can be jetted in the form of microdroplets onto a hard to solder substrate and that the modified droplets will wet and bond to the surface of the hard to solder substrate. This makes it possible for the first time to create solder bumps on bare uncoated hard to solder substrates such as aluminum and indium tin oxide without the need for first applying a different surface which conventional solder will wet.

18 Claims, 6 Drawing Sheets

DIRECT SOLDER BUMPING OF HARD TO SOLDER SUBSTRATE

CROSS REFERENCE TO RELATED APPLICATION

This application is a continuation in part of application Ser. No. 08/581,273 filed Dec. 29, 1995 (now U.S. Pat. No. 5,772,106, entitled Printhead for Liquid Metals and Method of Use for which benefit is claimed under 35 U.S.C. § 120.

BACKGROUND OF THE INVENTION

1. Field of the Invention

The present invention describes a method of applying microdrops of solder to hard to solder substrates, particularly aluminum and indium tin oxide.

2. Background of the Prior Art

Microelectronic semiconductor devices are useless without electrical contacts between electrical circuits and other devices. Electronic contacts and connections must be suitable and reliably made. In general, wafers containing multiple integrated circuits (IC's) or individual dies require a number of expensive, time consuming, environmentally unfriendly steps because the substrate will not directly accept solder. In general, the goal of the electronics industry is to start with an aluminum or aluminum alloy metallized silicon surface and arrive at individual solder "bumps" at particular locations in good mechanical, electrical and thermal contact with the aluminized surface of a wafer or die. Surprisingly, the invention permits solder bumps to be directly made in good electrical, thermal and mechanical contact at desired locations on aluminum or indium tin oxide (ITO) surfaces without the necessity of many of the intermediate steps normally required.

Most prior art processes first deposit a conductive layer over the whole surface of a wafer. The most common surface is usually aluminum. Further processing of wafers with individual IC's involves application of photoresist coatings with openings where individual interconnect pads are located. These pads are converted by plating the aluminum with sequential layers of other metals such as nickel, copper and finally solder. Unwanted plated areas are removed by etching. The remaining solder is supplied with flux and heated to reflow the solder into balls with the aid of surface tension to create "bumps" which serve to make electrical and mechanical connections to other parts. The resulting solder bumps must be inspected and tested because the existence of multiple process steps significantly increases the chances of failure. Even freshly deposited aluminum is hard to solder. Flux is used as a vehicle for dissolving the oxide and allowing solder to stick and bond.

Soldering directly onto aluminum without flux has been a goal in the electronics industry for decades and the authorities all recognize that there is no practical way to do it. People believe oxides on aluminum interfere with adhesion and wetting of solders. Use of flux to dissolve the oxide is undesirable in microelectronics fabrication because its presence after soldering is highly undesirable for a number of reasons, not the least of which is corrosion.

The other of the most frequently used hard to solder substances is indium tin oxide (ITO) which is used in displays. ITO is used in thin film format for the connectors of flat panel displays. It has sufficient conductivity and is transparent to visible light. Displays have glass sheets bonded together with the area between the sheets filled with liquid crystal material that make up the displays. ITO is a way to apply voltages to areas of the glass. There are a large number of electrical connections (lines) and each has to be connected to IC's distributed around the edges which drive it. Temperature limitations are of concern because of the materials used in the displays. Consequently, low melting In/Sn solders are employed. The usual method used to interconnect to ITO is to deposit metal pads onto the ITO and interconnect to the metal pads. Some methods require applying a solderable metallized coating onto the ITO in a vacuum where the metallic coating is evaporated or "sputtered" with masking to control deposition. A process that would allow for direct soldering to the ITO would be a major cost saving in the fabrication of flat panel displays or other optical devices that use ITO as the conductors.

A typical process for creating solder bumps has the following characteristic steps although there are a number of additional operating steps as well in getting from one main characteristic step to another. A process typically includes 1.) an aluminum or aluminum alloy metallized surface; 2.) sputtering, evaporation or plating of an adhesion/barrier metal such as Cr, TiW, etc.; 3.) deposition of a solderable surface by plating or evaporation of solderable metal, such as Cu, CuNi, Ni, etc.; 4.) deposition of a protective layer, such as Au, etc.; 5.) solder deposition such as by plating, printing, etc.; and 6.) reflow of the solder with the aid of flux to form bumps. In the invention described herein, characteristic steps 2, 3, 4 and 6 are eliminated.

Of the prior art processes, evaporation can provide bumps with the best uniformity and composition in volume production. The most commonly used evaporated bumps are those based on Pb/Sn (e.g., the IBM C4 process) deposited on a wafer through a molybdenum metal mask. The molybdenum metal masks are first aligned to the bond pads on the wafer and clamped. For interconnect systems such as C4, this metallization consists of chromium, copper, and gold. Following metallization the wafers and shadow mask assembly are transferred into a solder evaporation system. Here a known composition and volume of solder is evaporated onto the bond pads. The shadow mask is then removed. For several decades 100 micrometer diameter bumps on a 250 micrometer pitch have been demonstrated in manufacturing environments with this method. A limitation influencing the minimum size and pitch capability of evaporation solder bumps is the metal mask technology. This process can be characterized by the following steps: 1.) provide an aluminum alloy pad; 2.) deposit chromium; 3.) deposit copper; 4.) deposit is flash of gold; 5.) deposit a thick layer of solder; and 6.) reflow the solder to form bumps. There are also wet electroplating processes which have a similar number of characteristic steps and electroless processes which mimic the above. Knowledge of an improved solder that would wet glass, U.S. Pat. No. 5,120,498, has not resulted in a successful application to solder bumping despite the fact that the patent has been public since 1992.

SUMMARY OF THE INVENTION

A method has been formed for direct solder "bumping" of wafers, chips and interconnection pads or traces on hard to solder surfaces such as aluminum and indium tin oxide. It has been discovered that conventional solders modified by the addition of a light reactive metal can be jetted in the form of microdroplets onto a hard to solder substrate and that the modified droplets will wet and bond to the surface of the hard to solder substrate. This makes it possible for the first time to create solder bumps on bare uncoated hard to solder substrates such as aluminum and indium tin oxide without the need for first applying a different surface which conventional solder will wet.

A solder jetting device built around an electromechanical transducer of piezoelectric material is able to precisely form spherical microdroplets of the liquid modified solder composition in an inert atmosphere produced in a gap between the solder jetting device and the surface of a hard to solder substrate. The droplets are produced by electrical impulses generated by a programmed controller which is able to move the workpiece in a predetermined manner relative to the jetting device so that microdrops are deposited precisely on the bare uncoated pads or traces where bumped connections are desired. Many steps in the prior art processes mentioned in the Background above are eliminated.

Conventional solders comprising at least two metals selected from the group consisting of Pb, Sn, In, Bi, Cd, Sb, Hg, Ga, Ag and Au can be modified with a light reactive metal selected from the group consisting of Li, Na, K, Rb, Cs, Ca and Mg. It appears that a small nominal weight percentage of the light reactive metal is effective for allowing otherwise conventional eutectic solder compositions and others to wet and adhere to a hard to solder surface. A very small amount of a light reactive metal is effective. Lithium in an amount as low as 0.01 percent was sufficient to create wetting and bonding of 63 Sn/37 Pb solder to bare aluminum although about 0.1 nominal weight percent or more of the light reactive metal is preferred to get the desired effect. Modification of 52 In/48 Sn solder with a nominal weight percent of about 0.1 percent lithium was sufficient to obtain wetting and bonding of microdroplets to form solder bumps on bare indium tin oxide.

It is recognized that the actual solubility of these components in a base solder composition will vary. Some of them will have low solubility or form intermetallic compounds, but as shown in U.S. Pat. No. 5,120,498, these compositions can be used to wet and adhere to glass despite these factors. The exact mechanism is not well understood. It appears that only very small amounts of a light reactive metal additive are effective for wetting and bonding modified conventional solder compositions in the form of solder bumps as applied to hard to solder substrates.

DETAILED DESCRIPTION

Figure 1:
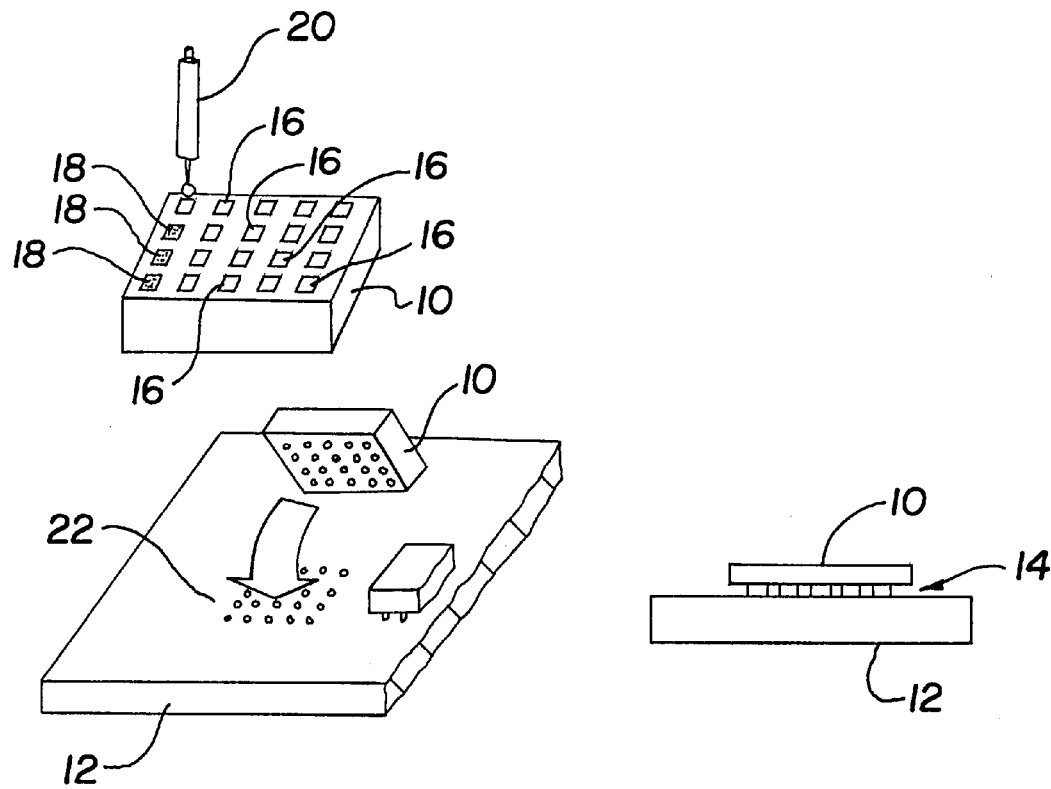
FIG. 1 schematically illustrates the application of the invention to the preparation of an integrated circuit chip for conventional mounting and bonding to connect pads or bond pads on a substrate.

An overview showing the general use of the inventive process is illustrated in FIG. 1. In high density electronic manufacturing processes, semiconductor integrated circuit chips are bonded to a substrate by a solder reflow process. With reference to FIG. 1, the right hand illustration shows the semiconductor integrated circuit chip or chip 10 operatively joined to hard to solder substrate 12 at a series of soldered interconnections 14 after the final solder reflow process has been completed. The interconnects 14 are in the form of solder bumps 18 being applied directly to interconnect pads 16 of chip 10 by means of solder jetting device or printhead assembly 20 which controllably and sequentially emits droplets of liquid solder onto interconnect pads 16. The solder used is modified by alloying, despite limited solubility, with light reactive metal elements. Droplets are formed in the manner depicted generally in FIG. 8. They wet and freeze on the substrate surface as hemispherical "bumps", without further processes.

In the prior art processes, the interconnect material between chip 10 and substrate 12 is in the form of a solder layer or layers prior to the solder reflow process. The solder bumps are created on the pads 16 of an integrated circuit chip 10 rather than being placed there. Some of the various prior art processes which create solder bumps on pads include 1.) deposition through a mask for solder reflow, 2.) electroplating for solder reflow, and 3.) pick-and-place of solder bumps, etc. Solder reflow is achieved by heating the part and holding for a time above the melting point of the solder whereby surface tension effects aided by unwettable areas around the pads causes the previously applied solder to draw up into a rounded raised bump.

Surprisingly, it has been discovered that solder bumps 18 made from a modified solder composition can be printed in their finished form directly upon pads 16 by solder jetting device 20, without the benefit of a solder layer or solderable surface coatings on the pads. It has been found that conventional solder compositions that are modified by alloying with seemingly small amounts of light reactive metals can be jetted successfully through a solder jetting device to be described. Importantly, the jetted microdrops will wet and stick to hard to solder substrate surfaces, mainly bare aluminum or bare indium tin oxide (ITO). These discoveries have made it possible to eliminate many steps from the conventional processes which are described in the Background of the Invention and Summary Once the "bumped" chip is arrived at, either by the conventional process or the process of the invention, chip 10 in the middle part of FIG. 1 is placed upside down on substrate 12 such that the solder bumps are aligned with the correct matching footprint of solder wettable terminals or connect pads 22 on substrate 12. Heat is then applied and all the joints or interconnections between pads 16 on chip 10 and solder wettable terminals or connect bond pads 22 on substrate 12 are made simultaneously by reflowing the solder of the solder bumps to arrive at a completed connection illustrated schematically on the right hand side of FIG. 1. This is sometimes referred to as a flip chip process. The inventive process, in addition to eliminating process steps by printing solder bumps directly on hard to solder surfaces, is especially adapted to further miniaturization of the process through the use of XY stage devices in cooperation with the inventive solder jetting device and precise digital positioning control.

Figure 2:
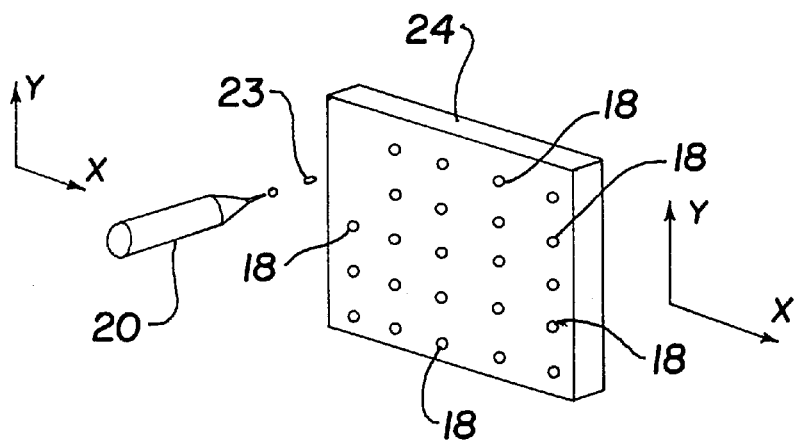
FIG. 2 schematically illustrates a jetting device of the invention printing an array of solder bumps directly onto a hard to solder substrate.

FIG. 2 schematically illustrates the inventive process of printing solder bumps directly onto hard to solder substrate in which the solder jet device 20 is operated in drop-on-demand mode, under conditions to be described, upon a heated hard to solder substrate on which solder bumps 18 have been printed directly. A solder droplet 23 is seen being directed to the surface of substrate 24 in liquid form. Solder droplet 23 represents a conventional tin-lead solder or a conventional indium-tin solder or other base solder composition modified by alloying with small amounts of light reactive metals, such as lithium.

Figure 4:
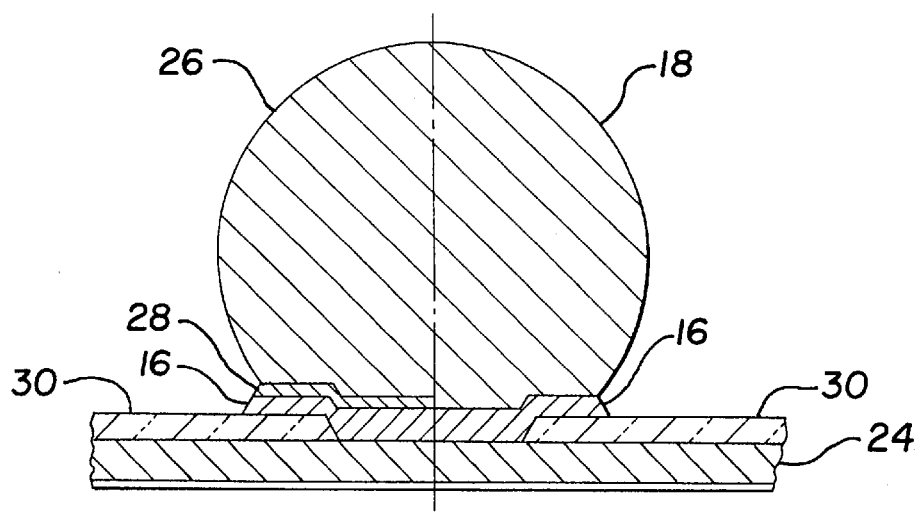
FIG. 4 illustrates a greatly magnified solder bump on a semiconductor pad in vertical cross section with one half illustrating a conventional structure while the other half illustrates the structure produced by the inventive process using a modified solder composition.

Conventional processes for creating solder bumps are described in U.S. Pat. No. 5,229,016 which is incorporated herein by reference. An enlarged view of a conventional solder bump is illustrated schematically in the left side of FIG. 4. FIG. 4 illustrates a conventional solder bump 26 on the left side of the dotted center line and a solder bump 18 produced by the inventive process on the right side of the dotted line in FIG. 4. A hard to solder substrate 24 has a typically aluminum interconnect pad 16 and one or more solder receptive layers 28 evaporated or plated onto the surface of interconnect pad 16. A non-solder wettable passivation layer 30 may be present on the surface of hard to solder substrate 24 to aid in creating conventional solder ball 26 in a furnacing operation. In contrast, solder bump 18 comprised of a modified solder composition is applied directly to the aluminum or aluminum alloy interconnect pads 16 without the necessity of having any solder receptive layer or layers 28. Solder bump 18 is produced directly on pad 16 without the need for additional furnacing operations.

Figure 3:
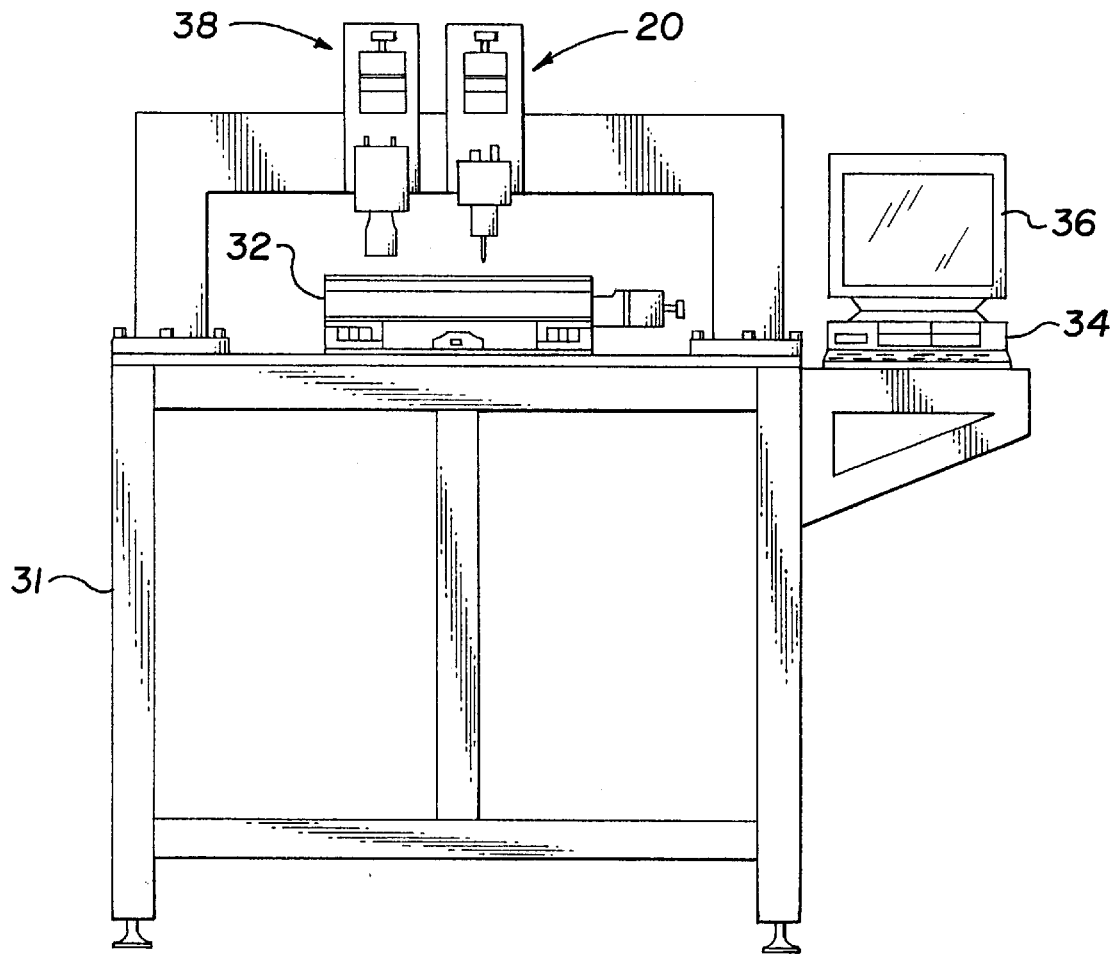
FIG. 3 illustrates the general layout of equipment employing an XY stage for moving a substrate or wafer, a solder jet device for dispensing the solder, a vision system and a control system useful for printing the array shown in FIG. 2.

FIG. 3 schematically represents a set up that can be used for printing solder bumps 18 of the modified solder composition directly onto individual pads or traces of a hard to solder substrate. Some of the important elements are shown in FIG. 3. Solder jetting device 20 is supported on table 31 spaced above an XY stage 32 operationally connected to programmable controller 34 having monitor 36. Wafers, chips, or other microelectronic parts which are mounted on table 32 may be moved in a predetermined pattern under the control of controller 34 to match the interconnect pads or other desired locations where solder droplets produced by solder jetting device 20 are to be deposited. Alternatively, the jetting device could be staged and moved instead.

Suitable power supplies and drive electronics are provided to operate a piezoelectric transducer within solder jetting device 20, preferably in drop-on-demand mode. Heaters are provided to elevate and maintain the temperature of the substrate mounted on stage 32 and to maintain and control the temperature of the molten modified solder contained in device 20. A vision system 38 is operatively connected to controller 34 as an aid to adjusting the output of device 20. The vision system includes a strobe light useful in generating visual representation of drops being formed at the printhead of solder jetting device 20 along with a suitable video camera which is adjusted and the images magnified to produce a display on monitor 36. A more complete description of solder jetting device 20 and the operation of the solder jetting device and allied equipment is found in copending U.S. patent application Ser. No. 08/581,273 which is incorporated in its entirety herein by reference. A brief description of the solder jetting device shown in FIGS. 5–7 is given here to illustrate its operation.

Figure 5:
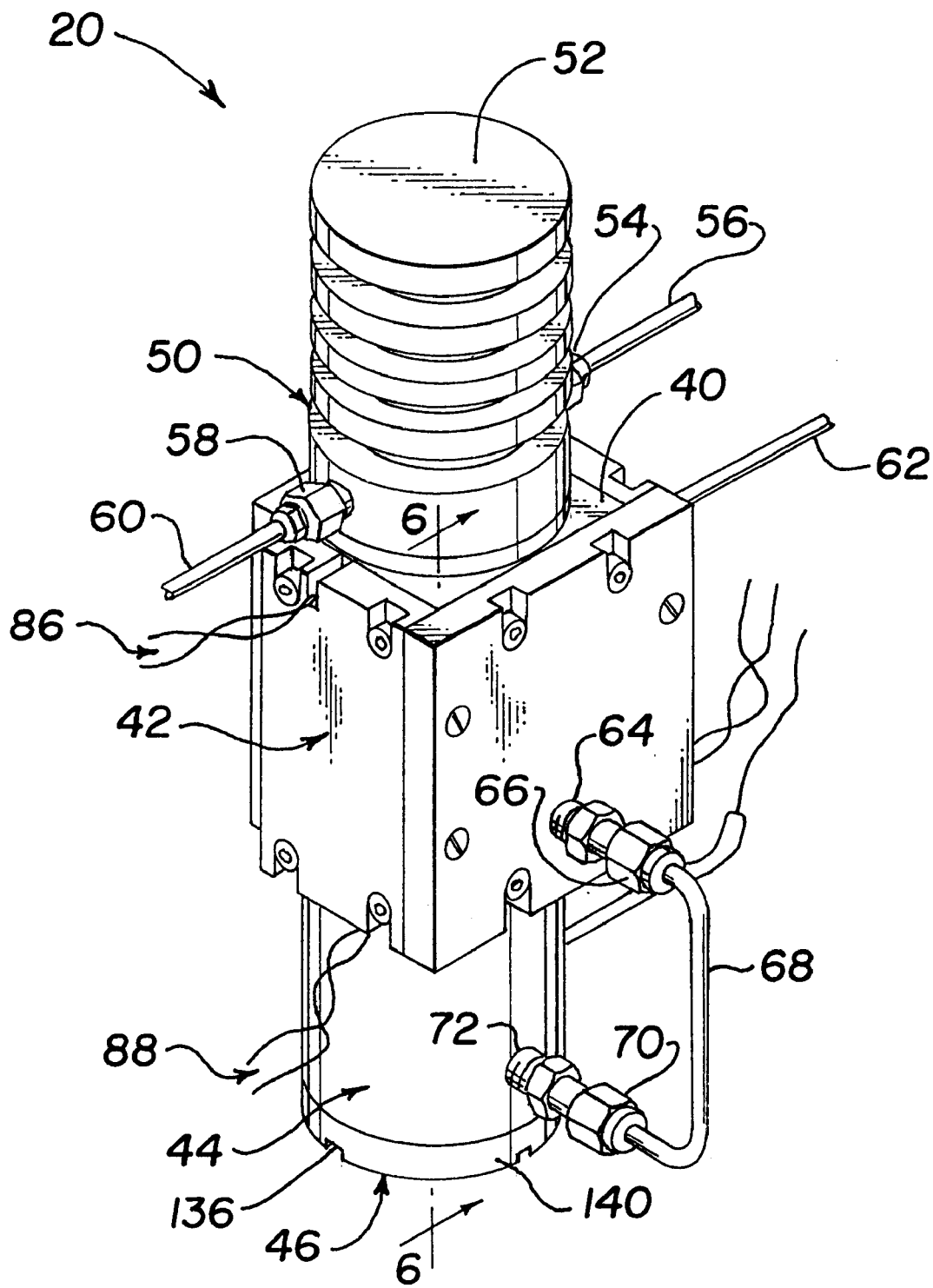
FIG. 5 is a perspective view of a solder jetting device which is used with the set up of FIG. 3 for printing an array of solder bumps as indicated in FIG. 2.

In FIG. 5 the solder jetting device or printhead assembly is seen in its entirety, generally referred to by reference numeral 20. Printhead assembly 20 has a heated housing comprising an upper housing portion 40 with a jacket generally designated 42 and a lower housing portion 44. Lower housing portion 44 may be referred to as the "printhead". The housing portions may be separate parts bolted together with bolts not shown in the drawings. Printhead assembly 20 has a lower end having a working surface 46 from which liquid solder droplets in the form of small spherical drops are emitted. Upper housing 40 contains a reservoir 48 for melted solder better seen in FIG. 6. The upper end 50 of upper housing 40 is sealed by a closure which is cap 52. Cap 52 is preferably non-metallic and removable for loading solder into reservoir 48. The upper portion of upper housing 40 has connection means 54 for inert gas supply line 56 from a controllable source of inert gas. Connection means 58 is connected to vacuum line 60 running to a controllable source of vacuum. Jacket 42 has connected thereto an inert gas line 62 from a controllable source of inert gas. Jacket 42 has a supply inlet and connection connected to an inert gas supply line 62. Jacket 42 has an outlet 64 with a connection means 66 and a line 68 seen in FIGS. 5 and 6 which transfers inert gas from line 62 and passages within jacket 42 through connection 70 to an inlet 72 of a means for uniformly distributing a flow of inert gas around an exit orifice.

Figure 6:
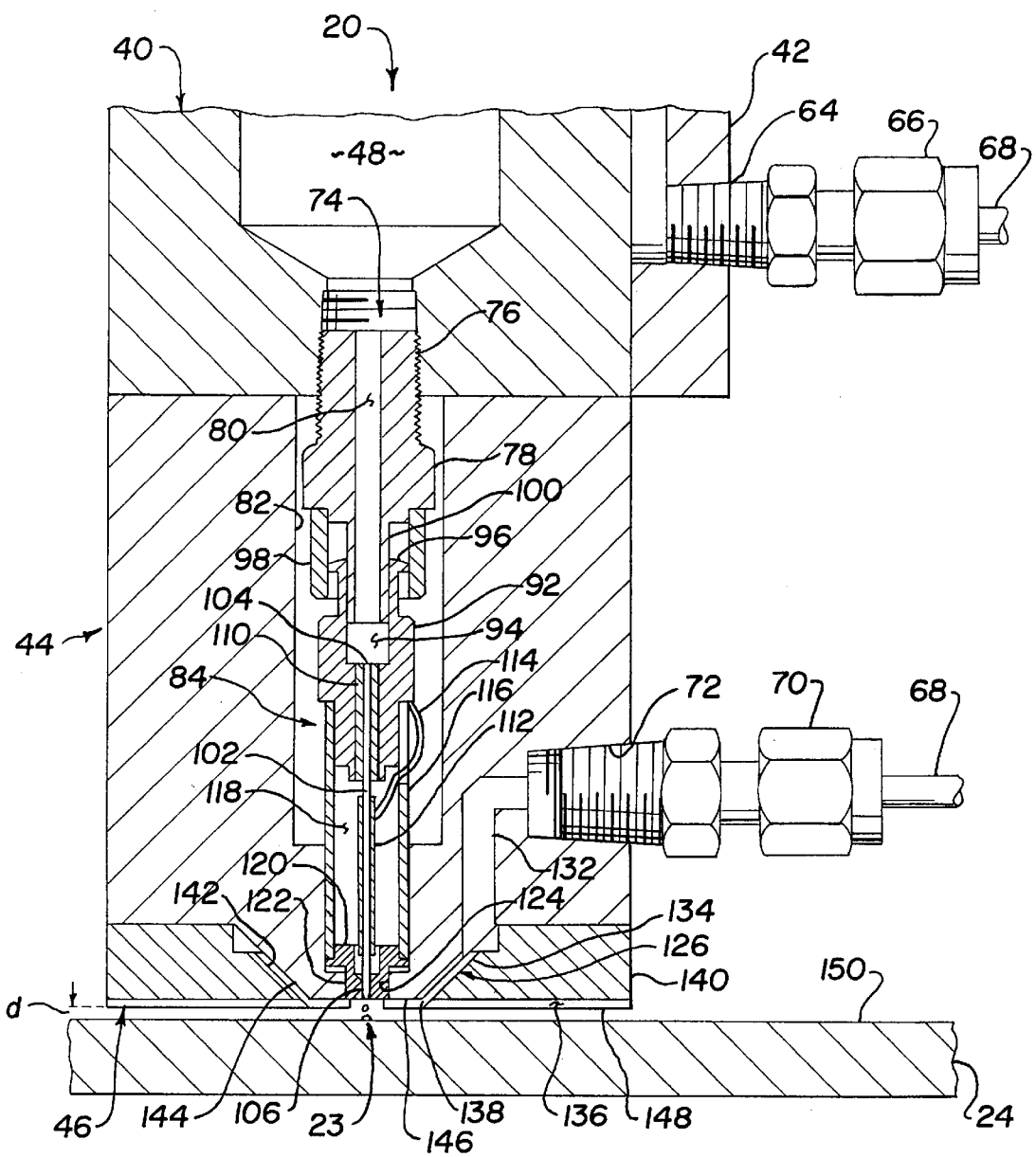
FIG. 6 is an elevational view in cross section through the center of the solder jetting device of FIG. 5 along the line 6—6 in FIG. 5.
Figure 7:
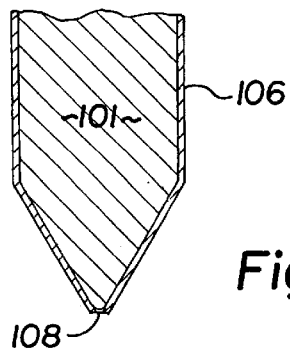
FIG. 7 is an enlarged view of the tip in FIG. 6 from which solder droplets are jetted.

Referring now to FIG. 6, upper housing portion 40 is open at the top when cap 52 is removed for loading solder into centrally located reservoir 48. Reservoir 48 has an opening 74 at the bottom leading into threaded passage 76 at the bottom of upper housing 40. A threaded fitting 78 having an internal passageway 80 leading to opening 74 is threaded into passage 76. A longitudinally extending internal cavity 82 is centrally located within lower housing 44, extending throughout lower housing 44 to working surface 46. Internal cavity 82 provides sufficient room for fitting 78 and a solder jetting assembly 84.

The housing of solder jetting device or printhead assembly 20 is heated in order to melt and hold solder and solder alloys in reservoir 48 at a working temperature above the melting temperature. Upper housing 40 has a longitudinally extending space for an electrical rod heater having power supply 86 extending through an opening in the housing and connected to a suitable power source. Lower housing 44 has a similar electric rod heater having power supply 88 extending from an opening in the housing and connected to a suitable power source. One or more thermocouples in the housing are connected to a controller that operates the heaters. These features enable the housing to be maintained at a suitable operating temperature above the melting point of the solder. Inert gas is circulated through serpentine grooves in jacket 42 which heats it before it travels to the working surface where it shrouds the droplets being formed thereby preventing oxidation.

More details of solder jetting assembly 84 and its relation to the lower housing portion 44 are shown in FIG. 6. In FIG. 6, printhead assembly 20 is shown in operating position with working surface 46 spaced a working distance or gap "d" above a substrate 24 on which one or more or an array of solder droplets 23 are to be deposited to make solder bumps or solder connections. Solder jetting assembly 84 is positioned within internal cavity 82 of lower housing 44. Solder jetting assembly 84 has an upper connection end 92 having an opening into a space 94 and a luer fitting 96 at the upper end. Fitting 78 extends downwardly in cavity 82, having a lower connection end 98 containing complimentary engaging surfaces for connection of luer fitting 96 around a stem 100. Stem 100 provides a continuation of internal passageway 80 to space 94. It is contemplated that a conventional filter can be interposed along the molten metal pathway for the purpose of removing undissolved foreign matter that might otherwise clog device 84. Lower housing 44 may be disconnected from upper housing 40 in order to remove, install or service jetting assembly 84.

Jetting assembly 84 includes elongated conduit 102 having an inlet end 104 in communication with melted solder at space 94. Elongated conduit 102 has an outlet end 106 with exit orifice 108 best seen in FIG. 7, filled with melted solder 101 during operation, positioned adjacent to working surface 46. Approximately the upper one-third of elongated conduit 102 is supported by closely fitted sleeve 110. Most of the lower two-thirds of elongated conduit 102 is closely fitted with an electromechanical transducing device 112 having electrical operating leads 114. Leads 114 pass through an opening in a mounting shield 116 surrounding the preferred high temperature resistant piezoelectric transducer 112. Space 118 within shield 116 may be filled with electrical insulation in the form of "potting" material. Mounting shield 116 has an opening in its lower end capped by an end cap 120 comprising an end plug having a reduced diameter portion 122. Reduced diameter portion 122 is fitted into an opening 124 of a conical formation 126 centered at the bottom of lower housing 44. End cap 120 has an opening in its reduced diameter portion 122 which supports outlet end 106 of conduit 102 in sliding relation. Outlet end 106 is not rigidly held by end cap 120 so as to avoid interfering with acoustical waves generated by transducer 112 which generate melted solder droplets 23.

In the preferred embodiment, elongated conduit 102 is preferably an elongated glass tube drawn to a very fine exit opening which can be done according to the procedures of U.S. Pat. No. 5,053,100 which disclosure is incorporated herein by reference. Sleeve 110 is preferably a stainless steel sleeve. The solder jetting device is preferably a piezoelectric transducer 112 in a tubular configuration surrounding and in contact with a portion of the outer surface of conduit 102. Assembly 84 is adapted to controllably eject tiny droplets of melted liquid solder received from the reservoir in the housing and direct them directly away from working surface 18 toward the surface of workpiece 24. It is within contemplation of the invention that the tubular transducer itself could form part of the conduit. The diameter of the working surface 46 of the embodiment shown in the Figures was two inches and the other parts are generally to scale. This is the same diameter as the lower housing.

Printhead assembly 20 has a means for uniformly distributing the flow inert gas around the exit orifice of the printhead whereby inert gas flows outwardly from the working surface 46 and creates, in cooperation with the surface of a workpiece 24, a virtually oxygen-free protective atmosphere around solder droplets 23 emitted from exit orifice 108 by jetting assembly 84 to permit deposition of spherical solder droplets at successive locations on the surface of a workpiece 24. In FIG. 6, inert gas from line 68 traverses inlet 72 and feed line 132. This gas passes to an annular orifice 138 spaced radially uniformly around exit orifice 108 at the working surface when working surface 46 is spaced a working distance from workpiece 24.

The inert gas discharged around orifice 108 is slightly above atmospheric pressure causing it to flow radially outwardly from around the exit orifice through working gap "d" thereby scavenging any initial oxygen and preventing oxygen from entering from atmosphere around the printhead to the tip where solder droplets are being formed. The means for uniformly distributing the flow of inert gas from line 68 further comprises a cone-shaped formation 126 which establishes annular chamber 136 leading outwardly from feed line 132 to annular opening 138. The supply of inert gas preferably enters annular chamber 136 at a single entry point of an annular ring 140. This configuration is designed to feed low velocity gas all around annular ring 140 through annular opening 138 without creating turbulence which would disturb solder droplets being formed.

Cone-shaped formation 126 preferably comprises cap 140 having an inner cone surface 142 which fits over a corresponding conical surface 144 centered at the lower end of lower housing 44 and spaced apart to create annular chamber 134 and annular orifice 138. Conical surface 144 terminates at its lower end at a flat circular shaped surface 146 surrounding opening 124. The outer edge of flat circular surface 146 and the inner edge of a corresponding opening in cap 140 form annular discharge opening 138. Thus flat circular surface 146 and the lower surface 148 of cap 140 comprise respectively first and second portions of working surface 46. A plurality of shallow radially extending grooves 136 may be provided in surface 148 of end cap 140 to allow a camera to view drops 90. They create acceptable discontinuities in the radial flow. In the preferred embodiment there are four such radial paths positioned around surface 148 of end cap 140, arranged at 90 degree intervals.

Bell jar experiments with printhead assembly 20 indicate 200 parts per million (PPM) was about the upper oxygen limit for operating solder jetting device 84 in drop on demand mode. Sometimes an irregular or continuous stream was produced at that oxygen level. It appears the higher oxygen concentration changes surface wetting characteristics at the tip by creating harmful oxidation which interferes with individual drop formation. Oxide is harmful to solder joint integrity. It appears that oxygen concentration of 100 PPM may be a safe useful upper limit for drop formation as well as solder joint integrity. Surprisingly, the presence of small amounts of highly reactive metal elements, such as lithium, in the jetting solder did not adversely affect the formation of solder droplets or cause undesirable wetting of the glass tip 106 as might have been expected. Wetting of the outside of the glass tip could form a "blob" which would make formation of individual drops difficult or impossible.

In operation, printhead assembly 20 is connected to power, programmable controllers and drivers. A temperature controller connected to the jetting device is ramped up to an operating temperature above the melting point of the solder to be used. Closure 52 is removed and a charge of modified solder alloy composition is placed in reservoir 48. After cap 52 is replaced, low pressure inert gas typically in the range of 1½–3 psig is introduced to reservoir 48 through line 56. This provides a blanket of inert gas to prevent crusting and is also adjustable to help drive solder down into the tip 106 and exit orifice 108. If the pressure above the solder in reservoir 48 is too high, an undesirable blob of solder may form on the tip or it may result in creation of undesirable satellites instead of controllable microdrops of solder. If the pressure above the solder in reservoir 48 is too low, the meniscus may be too high in outlet end 106 such that operation of transducer 112 will produce no drops at all. Under certain conditions a negative pressure in the reservoir is desirable. This was seen with pure Indium solder. Thus, vacuum may also be used to control operation of the printhead.

Some adjustment of the variables is expected and it is preferable that the adjustment be made with working surface 46 in close proximity a working distance "d" from a substrate or a substrate substitute because virtual absence of oxygen is one of the variables which favorably affects droplet formation. Close proximity to the substrate and an inert gas flow rate around 3.5 SCFH is preferred. The variables include the inert gas pressure above the solder, the rate of co-flow inert gas around the exit orifice, the gap at the tip, the drive voltage applied to transducer 112, the particular solder alloy and the temperature of the printhead assembly. Typically the solder droplet velocity is approximately 1½ to 2 meters per second. Sometimes it is helpful to heat the substrate or reduce the velocity of the solder balls to get better wetting of a substrate surface. Increasing the voltage of the pulse to the transducer 112 generally increases the velocity.

Once device 20 is jetting properly, a magnifying video camera in combination with a strobe light and monitor 36 can be adjusted to measure the velocity, observe droplet formation and make adjustments to get good wetting and sticking of the solder droplets to the substrate area to be soldered. After the set up is completed, the substrate to be soldered can be moved into position and manipulated in a conventional way by a servo-mechanism which moves the substrate in coordination with the jetting device according to a programmed pattern in an "XY" plane to deposit individual or a plurality of droplets in particular locations on the substrate. Another approach would be to move the printhead relative to the substrate.

If it is desired to cool down printhead assembly 20, the supply of inert gas to reservoir 48 through line 56 is stopped and vacuum in the range of about 15 to 20 inches of mercury is introduced into line 60 until the solder freezes is maintained while cool down of the jetting device is taking place. This prevents cracking or damage to the solder conduits.

Figure 8:
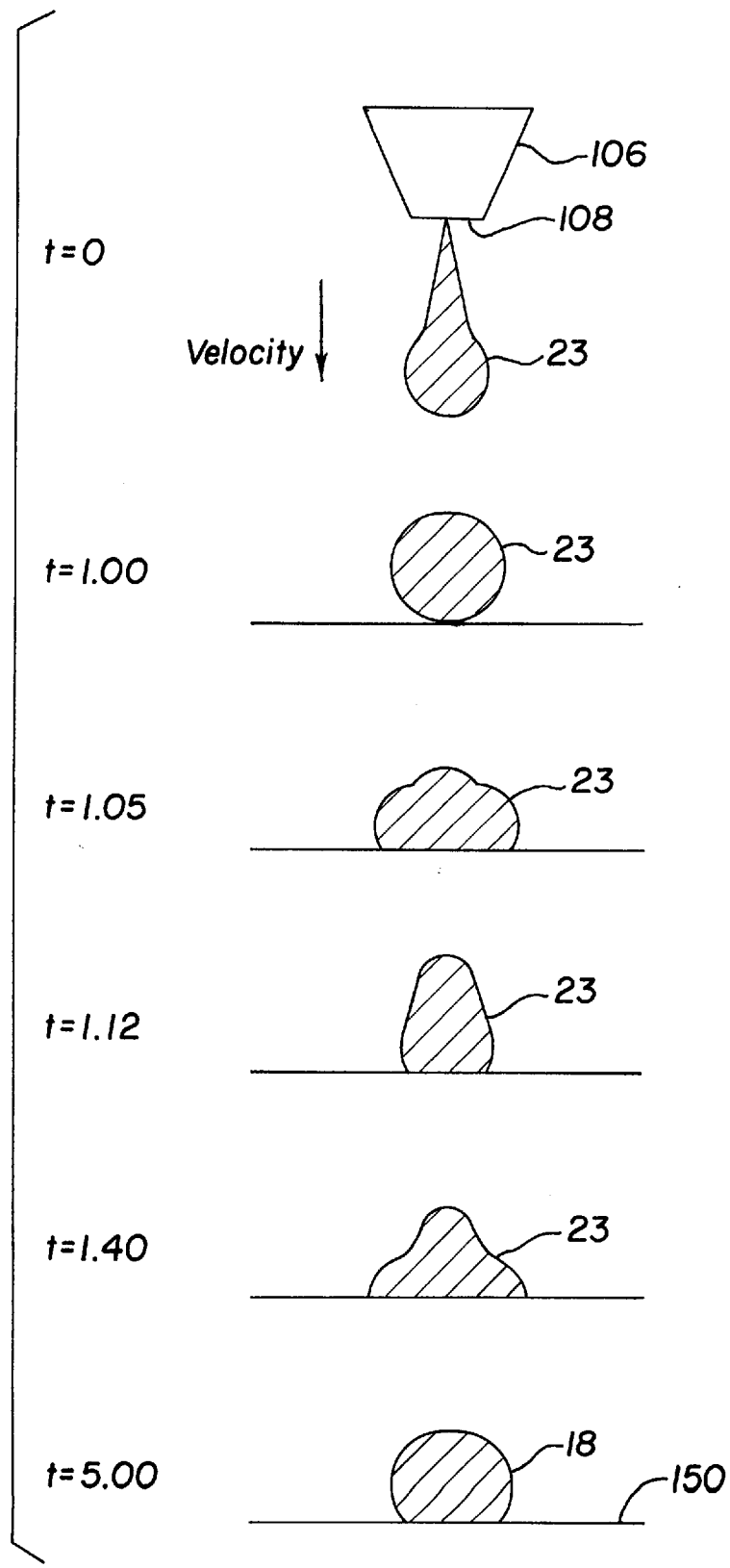
FIG. 8 illustrates on a time line the typical formation of solder bumps produced by the jetting device of FIGS. 5–7 directly onto a hard to solder substrate.

FIG. 8 is a schematic representation to illustrate that the formation and depositing of a microdroplet 23 is a dynamic process. A time scale on the left of FIG. 8 represents a progression of a microdroplet of liquid solder, of a modified composition to be described, in terms of milliseconds. A droplet is formed at tip 106 of solder jetting device 20 which exits from orifice 108 in an inert, virtually oxygen free atmosphere created in the gap "d" shown in FIG. 6 by a small flow of inert gas produced in the area around the tip from annular opening 138. The exiting drop immediately assumes a spherical shape as it travels to the surface 150 of a hard to solder substrate 24 shown as a horizontal line. Upon reaching surface 150, which is held at a suitable temperature elevated above room temperature, the drop distorts and wets the surface. The still liquid drop rebounds in typical shapes illustrated in FIG. 8 but sticks to the surface 150 as it begins to freeze. The drop finally freezes as a "bump" 18 because the temperature of substrate 24 is below the freezing temperature of the modified solder composition. Surface 150 is representative of bare aluminum pads or ITO as the case may be, although the conditions and the modified solder composition are selected for the particular substrate used. Solder which is not modified by alloying with a light reactive metal, such as a fractional percentage of lithium, does not wet such surfaces. Solder droplets of conventional unmodified solder composition produced by device 20 are observed striking the surface and bounding away despite attempts to alter the conditions to make them stick and bond. They do not wet unaltered aluminum or ITO surfaces under any set of solder jetting conditions that could be found.

A number of tests were performed using conventional 63Sn/37Pb and 62In/48Sn nominal solder compositions with and without the addition of a small amount of a light reactive metal. It was known from U.S. Pat. No. 5,120,498 that heavy metal solders modified by alloying with small, even minute, weight percentages of light reactive metal elements could be used to wet and adhere to glass as a substitute for the glass frits normally used to make laboratory apparatus. Cocks demonstrated that solder alloys contained within the multicomponent system or subsystems thereof, including the elements taken separately, consisting of Pb—Sn—In—Bi—Cd—Sb—Hg—Ga—Au—Ag can be modified by alloying with at least one light reactive metal selected from the group consisting of Li, Na, K, Rb, Ca, Cs, and Mg to produce a modified solder composition useful to wet and adhere to glass.

The process disclosed herein is based on the discovery of a method of successfully applying such heavy metal solder compositions modified with small amounts of reactive light metal elements directly to microelectronic interconnection pads and traces comprising hard to solder substrates, without special treatment steps otherwise required. In the examples that follow, an attempt is made to set forth the parameters employed in particular tests to give some idea of what conditions were used. It should be understood that these conditions are exemplary only and not meant to represent optimum conditions or the only conditions that would be expected to be useful to produce the desired result and that some experimentation will be required in a particular environment with a particular solder jetting device to obtain satisfactory results. What is important is that there is some set of conditions that will permit direct bumping of untreated aluminum or ITO with the modified solder compositions, that the presence of at least a small amount of a light reactive metal elements is essential to obtain wetting and adherent bonding and that it appears that no set of conditions could be found to work with conventional unmodified solder compositions.

In the examples that follow, the nominal solder composition is given as a weight percentage of the solder as ordered. The device temperature is attained by a heating rod and a thermocouple embedded in solder jetting device 20. The inert atmosphere referred to as a co-flow is based upon the flow rate of dry nitrogen introduced around the jetting tip 106 in the gap "d" at working surface 46. The orifice size at the tip 108 is estimated to be about 60 micrometers.

The drop size is estimated to vary from around 60 to 100 micrometers influenced to a considerable extent by the intensity and duration of voltages applied to the piezoelectric transducer 112, although the actual size of the microdroplets is not considered to be particularly significant except as needed to produce an appropriately size "bump" for making connections. In addition to adjusting the jetting parameters, a larger orifice can be used if desired in order to produce larger droplets.

It is preferable that the voltage applied to the piezoelectric transducer utilize a biased wave form voltage as disclosed in our U.S. Pat. No. 5,415,679 and our copending application 08/251,409 filed May 31, 1994, now U.S. Pat. No. 5,643,353, entitled "Controlling Depoling and Aging of Piezoelectric Transducers", both of which are hereby incorporated by reference. The pulse timing represents the estimated duration of the voltage applied while it is above and below the steady state level.

Figure 9:
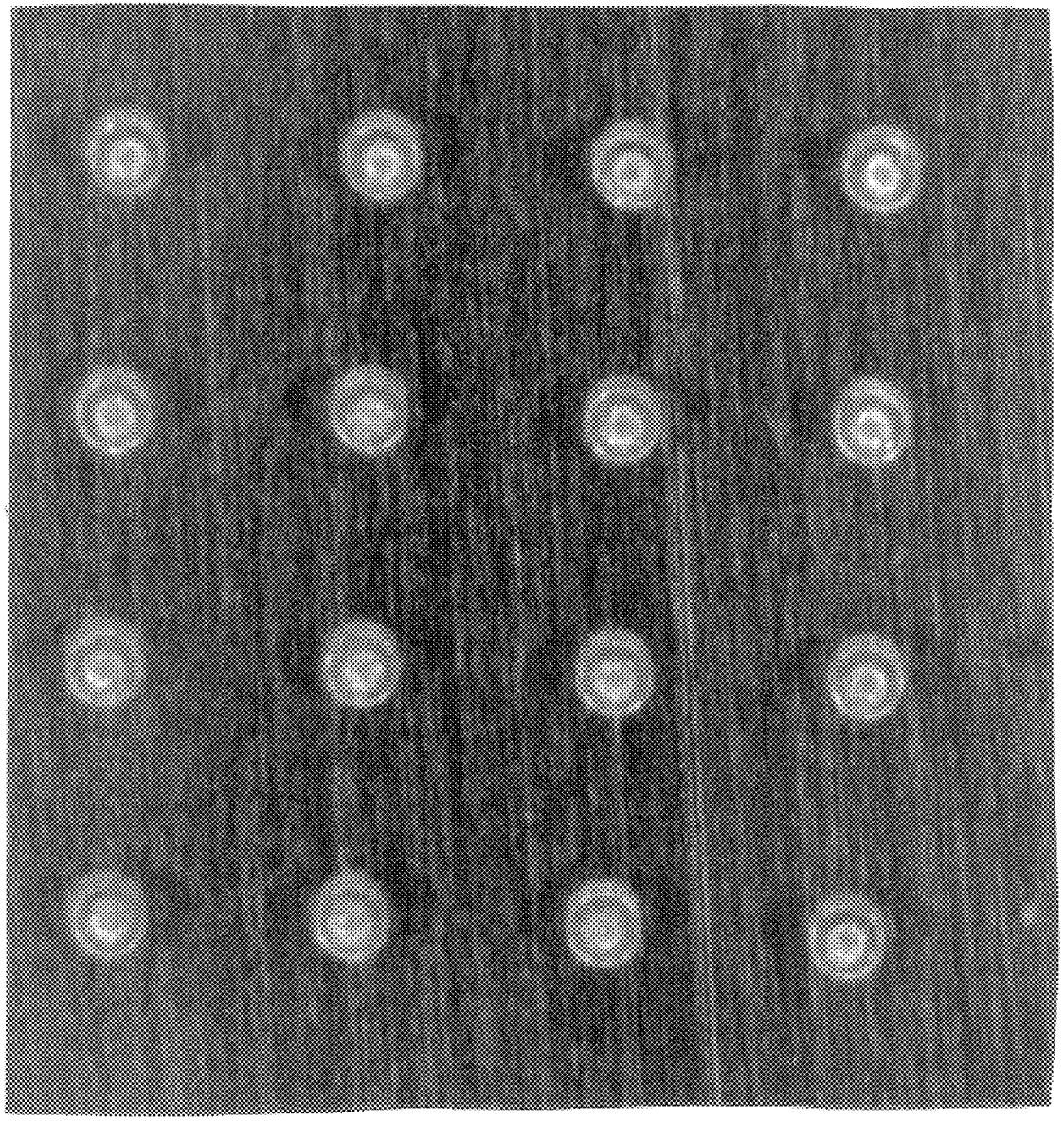
FIG. 9 is a photograph of an array of solder droplets which have wetted and bonded with a hard to solder substrate surface.

FIG. 9 is a photograph showing an array of solder bumps each about 70 micrometers in diameter made with the solder jetting device using 63Sn/37Pb solder modified with about 0.1 percent lithium as deposited on a bare aluminum substrate.

EXAMPLE 1

Tin-Lead Solder with Lithium

| Jetting Parameters | |
| --- | --- |
| Nominal Solder Composition | 63% Sn/37% Pb/0.1% Li |
| Device Temperature | 220° C. |
| Inert Atmospheres (Co-Flow) | 2SCFH of $N_2$ |
| Orifice Size (Tip) | 60 micrometers |
| Voltage Applied | ±36 volts |
| Pulse Timing | 270/180 microseconds |
| Back Pressure-Solder Reservoir | 0 |
| Drop Size | ~60 micrometers |
| Drop Velocity | 1.37 meters/sec. |
| Substrate | |
| Type | Aluminum |
| Pretreatment | Solvent clean, wipe and dry |
| Temperature | 160° C. |

Observations

The solder droplets wetted and stuck to the substrate surface. The bonded solidified droplets had a hemispherical shape and could not be removed with a fingernail. They appeared to be bonded to the surface.

EXAMPLE 2

Tin-Lead Solder—Conventional

Using conditions similar to those of Example 1, a nominal solder composition of 63% Sn/37% Pb without a light reactive metal additive was jetted onto the aluminum substrate.
Observations The individual jetted droplets of solder would not wet the substrate surface. The droplets were observed bouncing off the surface despite attempts to alter the parameters.

EXAMPLE 3

Indium-Tin Solder—Conventional

Using conditions similar to Example 1 except for a jetting temperature of about 130° C., a nominal solder composition of 52% In/48% Sn without a light metal reactive additive was jetted onto the aluminum substrate.
Observations The individual jetted droplets of solder would not wet the substrate surface. The droplets were observed bouncing off the surface despite attempts to alter the parameters.

EXAMPLE 4

52% Indium—48% Tin Solder with 0.01% Lithium

| Substrate | |
| --- | --- |
| type | Indium tin oxide on glass |
| Pretreatment | Positive photoresist stripper solution |
| Temperature | 125° C. |

Jetting Parameters

Not recorded. Believed to be similar to those given in Table 1 below. This example preceded examples using solder with a greater percentage of Lithium.
Observations The ability to controllably jet solder containing a small amount of light reactive metal was demonstrated. Unlike 52% In/48% Sn solder without a light reactive metal component, microdroplets of solder were observed wetting and bonding to the ITO surface. When the bumps produced were forcibly removed, evidence of bonding was observed.

TABLE 1

| 52% Indium-48% Tin Solder with 0.1% Lithium | |
| --- | --- |
| Jetting Parameters | |
| Device Temperature | 160° C. |
| Pulse Timings | 110/180 microseconds |
| Voltage | Up to ±99 volts |
| Back Pressure | 0 to 2.5 psig |
| Drop Velocity | 0.62 to 2.5 meters/sec. |
| Substrates | |
| Aluminum Pretreatment | Solvent wash, wipe and dry |
| ITO Pretreatment | Positive photoresist stripper solution |

| Test | Substrate | Substrate Temperature | Results |
| --- | --- | --- | --- |
| 1 | Indium Tin Oxide | 120° C. | Droplets wet and bonded |
| 2 | Indium Tin Oxide | 130° C. | Droplets wet and bonded |
| 3 | Indium Tin Oxide | 140° C. | Droplets wet and bonded |
| 4 | Bare Aluminum | 120° C. | Droplets wet and bonded |
| 5 | Bare Aluminum | 130° C. | Droplets wet and bonded |
| 6 | Bare Aluminum | 140° C. | Droplets wet and bonded |
| 7 | Gold | 120° C. | Droplets wet and bonded |
| 8 | Silver | 120° C. | Droplets wet and bonded |
| 9 | Nickel | 120° C. | Droplets wet and bonded |

Observations

Spot diameters of the solidified droplets were about 70–100 micrometers. In general, the printed patterns looked better at lower velocities.

Although the jetting device temperature shown in Table I was about 160° C., there were a number of tests done with lower jetting temperatures down to about 125–130° C. The melting temperature of the modified 52In/48Sn solder was about 118° C.

It is believed that with freshly created aluminum or ITO surfaces which have not been contaminated with foreign substances, no pretreatment would be needed, although it is noted that no matter how fresh the surfaces are, conventional solders do not wet and adhere. Therefore solvent cleaning of the aluminum was merely a precaution. The same is true for the ITO samples tested. Square ITO samples were sawed from the glass the ITO was deposited on. As a precaution, to remove deposits resulting from handling and sawing, the samples were wiped with isopropyl alcohol, placed in a Microstrip 2001™ bath at 60° C. for 40 minutes, rinsed in distilled water for 10 minutes, dried with nitrogen and used soon after cleaning. Microstrip 2001™ is a conventional positive photoresist stripper liquid available from Olin Corporation, 120 Long Ridge Road, Stamford, Conn. 06904.

Observations of a number of the test strips after the solidified solder drops were forcibly removed with a probe showed that the solder bumps sheared such that there was a residue of solder left on the surface. This shows there was actual bonding taking place.

Although the invention has been disclosed above with regard to a particular and preferred embodiment, which is advanced for illustrative purposes only, it is not intended to limit the scope of this invention. For instance, although the inventive method has been set forth in a prescribed sequence of steps, it is understood that the disclosed sequence of steps may be varied. It will be appreciated that various modifications, alternatives, variations, etc., may be made without departing from the spirit and scope of the invention as defined in the appended claims.

What is claimed:

1. A process for applying solder bumps to a hard to solder substrate, comprising the steps of:

melting a modified solder composition comprising a solder base alloy modified by alloying with a light reactive metal in an amount effective to wet and bond to a hard to solder pad surface, selected from the group consisting of aluminum, and aluminum alloy, and indium tin oxide, to make a solder interconnect on a microelectronic part;

heating the surface of the pad;

creating and maintaining an inert gas atmosphere over the pad;

producing a microdrop of the modified solder composition within the inert gas atmosphere;

applying the microdrop to the heated surface of the pad while maintaining the inert gas atmosphere; and freezing the microdrop in electrical and mechanical contact with the surface of the pad.

2. The process of claim 1 wherein the base of the modified solder composition primarily comprises tin and lead.

3. The process of claim 2 wherein the base is modified with a light reactive metal consisting primarily of lithium.

4. The process of claim 1 wherein the solder base comprises at least two metals selected from the group consisting of Pb, Sn, In, Bi, Cd, Sb, Hg, Ga, Ag and Au.

5. The process of claim 4 wherein the light reactive metal is selected from the group consisting of Li, Na, K, Rb, Cs, Ca and Mg.

6. The process of claim 1 wherein the base of the modified solder composition primarily comprises tin and indium.

7. The process of claim 6 wherein the base is modified with a light reactive metal consisting primarily of lithium.

8. The process of claim 1 wherein the solder base comprises at least two metals selected from the group consisting of Pb, Sn, In, Bi, Cd, Sb, Hg, Ga, Ag and Au.

9. The process of claim 8 wherein the light reactive metal is selected from the group consisting of Li, Na, K, Rb, Cs, Ca and Mg.

10. A process for making solder interconnects directly on the surface of hard to solder microelectronic substrates, comprising the steps of:

melting a modified solder composition comprising a solder base modified by alloying with a light reactive metal in an amount effective to make a solder interconnect on a substrate pad for a microelectronic part selected from the group consisting of aluminum, aluminum alloys, and indium tin oxide;

providing a solder jetting device having a printhead in fluid communication with the melted modified solder composition;

placing the printhead near the surface of the substrate which has not been altered to accept a conventional solder whereby the printhead is spaced a working distance from the surface of the substrate and creates a gap effective for printing liquid solder droplets on the surface;

elevating the temperature of the substrate above ambient temperature and providing a shroud of inert gas in the gap created between the substrate and the printhead;

emitting droplets of the modified solder composition from the printhead within said gap;

depositing one of said droplets directly onto said surface of the hard to solder substrate while it is at said elevated temperature and shrouded by the inert gas within said gap whereby said one solder droplet wets, adheres to the surface and solidifies thereby providing a solder interconnect directly on the substrate.

11. The process of claim 10 wherein the base of the modified solder composition primarily comprises tin and lead.

12. The process of claim 11 wherein the base is modified with a light reactive metal consisting primarily of lithium.

13. The process of claim 10 wherein the solder base comprises at least two metals selected from the group consisting of Pb, Sn, In, Bi, Cd, Sb, Hg, Ga, Ag and Au.

14. The process of claim 13 wherein the light reactive metal is selected from the group consisting of Li, Na, K, Rb, Cs, Ca and Mg.

15. The process of claim 10 wherein the base of the modified solder composition primarily comprises tin and indium.

16. The process of claim 15 wherein the base is modified with a light reactive metal consisting primarily of lithium.

17. The process of claim 10 wherein the solder base comprises at least two metals selected from the group consisting of Pb, Sn, In, Bi, Cd, Sb, Hg, Ga, Ag and Au.

18. The process of claim 17 wherein the light reactive metal is selected from the group consisting of Li, Na, K, Rb, Cs, Ca and Mg.

* * * * *